United States Patent [19]

Werner

[11] Patent Number: 5,744,719

[45] Date of Patent: Apr. 28, 1998

[54] INTEGRATED MICROMECHANICAL SENSOR DEVICE

[75] Inventor: Wolfgang Werner, Munich, Germany

[73] Assignee: Siemens Aktiengesellschaft, Munich, Germany

[21] Appl. No.: 619,735

[22] PCT Filed: Sep. 20, 1994

[86] PCT No.: PCT/DE94/01092

§ 371 Date: Jun. 12, 1996

§ 102(e) Date: Jun. 12, 1996

[87] PCT Pub. No.: WO95/08775

PCT Pub. Date: Mar. 30, 1995

[30] Foreign Application Priority Data

Sep. 21, 1993 [DE] Germany ............... 43 32 057.0

[51] Int. Cl.$^6$ ............................................. G01P 15/00
[52] U.S. Cl. ........................ 73/514.32; 73/721; 73/514.34
[58] Field of Search ..................... 73/514.01, 514.32, 73/514.34, 721, 718, 727

[56] References Cited

U.S. PATENT DOCUMENTS

| | | |
|---|---|---|
| 4,483,194 | 11/1984 | Rudolf . |
| 4,611,387 | 9/1986 | Soclof . |
| 4,948,757 | 8/1990 | Jain et al. ............................ 437/240 |
| 5,279,703 | 1/1994 | Haberger et al. ..................... 56/635 |
| 5,282,924 | 2/1994 | Bayer et al. ......................... 156/643 |
| 5,318,652 | 6/1994 | Hocker et al. ....................... 73/721 |

FOREIGN PATENT DOCUMENTS

| | | |
|---|---|---|
| 0539311 | 4/1993 | European Pat. Off. . |
| 0539312 | 4/1993 | European Pat. Off. . |
| 0591554 | 4/1994 | European Pat. Off. . |
| 0605300 | 7/1994 | European Pat. Off. . |
| 4000496 | 2/1991 | Germany . |
| 4042334 | 11/1993 | Germany . |
| 2265754 | 10/1993 | United Kingdom . |
| 92/03740 | 3/1992 | WIPO . |

OTHER PUBLICATIONS

"How many sensors does a car need?", Kleinschmidt et al., Sensors and Actuators, 1992, pp. 35–45 (no month).

"Silicon Sensors for Automotive Applications", Sulouff, Jr., Sensors and Actuators, 1991, pp. 170–176 (no month).

Publ. Electronic Desing (Goodenough), Aug. 8, 1991, pp. 45–56, "Airbags Boom When IC Accelerometer Sees 50 G".

Publ. Semiconductor International/17, Oct. 1991, "Analog Devices Combines Micromachining and BiCMOS".

*Primary Examiner*—Elizabeth L. Dougherty
*Assistant Examiner*—Max H. Noori
*Attorney, Agent, or Firm*—Herbert L. Lerner; Laurence A. Greenberg

[57] ABSTRACT

The integrated micromechanical sensor device contains a body with a substrate (1) on which an insulating layer (2) and thereon a monocrystalline silicon layer (3), are arranged, in which the silicon layer has trenches as far as the surface of the insulating layer, and the side walls of the trenches as well as the side of the silicon layer adjacent to the insulating layer have a first doping type ($n^+$) and the silicon layer has a second doping type ($n^-$) at least in a partial region of its remaining surface, in which the silicon layer has a transistor arrangement in a first region (TB) and a sensor arrangement in a second region (SB), for which the insulating layer (2) is partly removed under the second region. Such a sensor device has considerable advantages over known devices with regard to its properties and its production process.

6 Claims, 3 Drawing Sheets

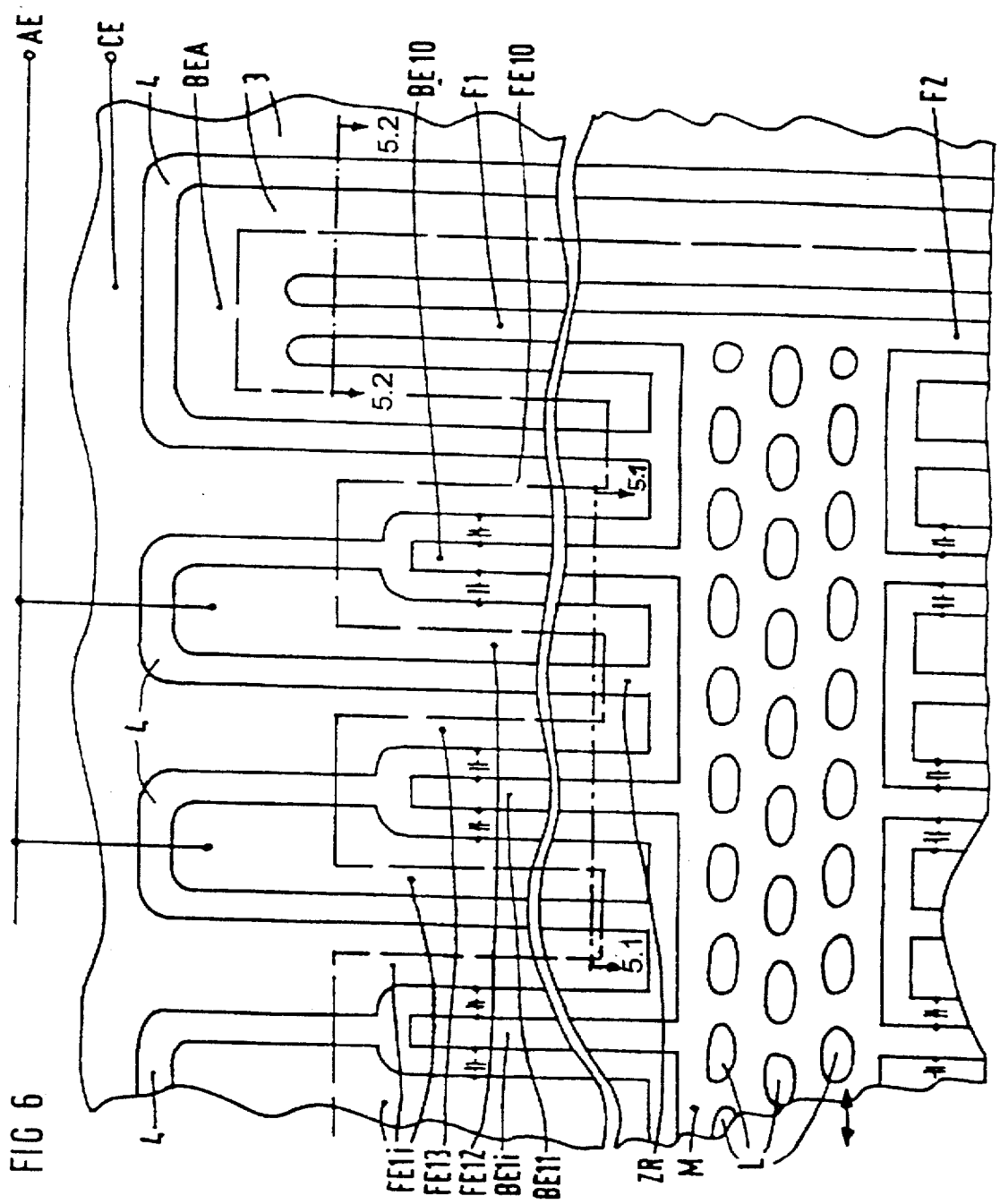

5,744,719

INTEGRATED MICROMECHANICAL SENSOR DEVICE

BACKGROUND OF THE INVENTION

1. Field of the Invention

The invention relates to an integrated micromechanical sensor device and to a process for its production.

Micromechanical sensors are becoming increasingly established in all fields of technology, for example in navigation systems and motor vehicles, in particular in conjunction with safety systems. A large proportion of such sensors form pressure and acceleration sensors. There is a requirement for reliable and compact sensors which are easy to produce and therefore inexpensive, with high measurement accuracy and good proportionality between the measured quantity and the output signal.

2. Description of the Related Art

Most pressure or acceleration sensors currently used are produced using high-precision mechanical methods or by using KOH etching technology on a silicon base (bulk micromachining). The sensor signal, to date usually produced by the piezoelectric effect, is evaluated separately from the sensor. There is, however, a trend toward intelligent sensors in which the sensor as well as the circuit for evaluating the sensor signal, and optionally a test circuit, are integrated on a chip on the basis of planar silicon technology. Evaluation of the piezoresistive or capacitive sensor signal, and linearization and amplification, take place using semiconductor circuits of known technologies. Such a sensor is, for example, disclosed by the published article F. Goodenough: Airbags Boom When IC Accelerometer Sees 50 G, Electronic Design, Aug. 8, 1991, pp. 45–56.

Whereas conventionally produced micromechanical sensors are relatively large, expensive and inaccurate, the abovementioned published article describes an improved embodiment. The production of this known so-called surface micromechanical (surface micromachining) sensor requires, as emerges in particular from the related further published article: Analog Devices Combine Micromachining and BICMOS, Semiconductor International, October 1991, 21 masks, namely 6 masks for the sensor process and 15 masks for a 4-µm BICMOS process. The comb-shaped sensor element for forming the capacitive sensor consists of a 2 µm thick polysilicon element and is connected to the substrate surface via springs, which are also made of polysilicon.

The production process for the known sensor is extraordinarily elaborate and expensive. Moreover, it is not certain that the polysilicon layers used for the mechanically moved parts of the sensor have sufficient long-term mechanical stability. In addition to this possible degradation over time, the mechanical properties such as the elastic modulus or intrinsic stress of polysilicon is sensitively dependent on the respective process conditions during production. The thermal annealing of the intrinsic stress requires additional heat-treatment steps in the production process, which has a detrimental effect on the electronic circuit simultaneously integrated in the sensor. Further to this, additional depositions of semiconductor layers are required in the production process. In one conceivable use of modern sub-µm-BICMOS circuits for the evaluation circuit of the sensor, the low process temperatures then used make it no longer possible to produce stress-free polysilicon layers.

DE-A-43 09 917, published after the priority date of the present application, describes the use of a monocrystalline silicon layer with an overlying silicon nitride layer.

SUMMARY OF THE INVENTION

The invention provides an integrated micromechanical sensor device, in which a body is formed with a substrate, with a monocrystalline silicon layer arranged thereon and with an insulating layer arranged in a predetermined region between the two, in which the silicon layer has trenches from its surface to its lower boundary, in which, in the silicon layer, the side walls of the trenches and the region of the silicon layer associated with the lower boundary of the silicon layer have a first predetermined doping type, and the silicon layer has a second predetermined doping type at least in a partial region, in which a transistor arrangement is provided in a first region of the silicon layer, above the insulating layer, and in which a sensor arrangement is provided in a second region of the silicon layer, in at least in part of which no insulating layer is present.

A process for the production of an integrated micromechanical sensor device provides the following steps:

forming a body with an insulating layer arranged on a substrate, and a monocrystalline silicon layer arranged thereon, the silicon layer having a predetermined doping type, etching trenches in the silicon layer as far as the surface of the insulating layer, doping the trench walls, producing a transistor arrangement in a first region of the silicon layer, and removing the insulating layer under a second region of the silicon layer.

After the trench walls have been doped, the trenches can be filled with an insulating oxide layer. However, after they have been produced, the trenches are preferably filled with a doping oxide (doping insulant layer) which acts as a doping source for the subsequent doping of the trench walls. The oxide in the trenches is likewise removed under the second region of the silicon layer, in conjunction with the insulating layer.

The sensor produced according to the invention contains monocrystalline silicon. It avoids the use of polysilicon layers for the mechanically moved parts for instance monocrystalline silicon is used for these parts. Monocrystalline silicon has accurately known mechanical properties which do not depend on the respective parameters of the production process. In addition, the mechanical properties are not subjected to degradation over time, so that the long-term stability is very great.

The invention has the further advantage that, with the use of known and available trench etching and filling processes, that it is fully compatible with VLSI. Further, the sensor device according to the invention is mechanically robust, since the moving parts are located in the silicon layer and not on the chip surface. Since the electrodes of the sensor extend perpendicularly to the chip surface, a high specific capacity (packing density) of the sensor is produced. At the same time, the sticking problem, that is to say adhesion of surfaces during or after a rinsing process, is mitigated since the stiffness of the sensor device perpendicularly to the oscillation direction is very great.

Finally, the sensor device according to the invention affords the considerable advantage that, when a bipolar or BICMOS process is used, the number of masks for producing the sensor device is not increased compared to a standard process in these technologies.

Developments of the invention are characterized in subclaims.

BRIEF DESCRIPTION OF THE DRAWINGS

The invention is explained in more detail below with the aid of figures of the drawing, in which FIG. 6 shows a plan view of a capacitive sensor arrangement.

DESCRIPTION OF THE PREFERRED EMBODIMENT

Figure 1:
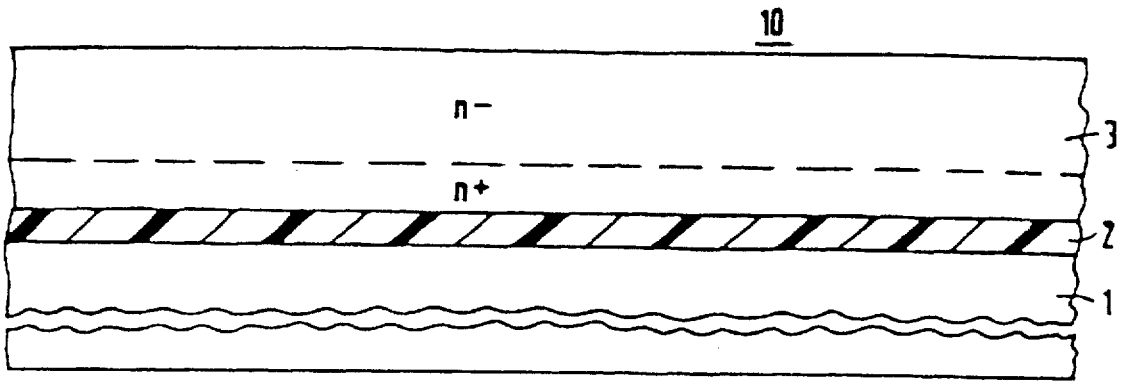
FIGS. 1 to 5 show cross-sections through a device according to the invention in various steps of the production process.

FIG. 1 shows a base body 10 formed during the production of the integrated micromechanical sensor device. An insulating layer 2 is arranged on a substrate 1 and a monocrystalline silicon layer 3 is arranged on this insulating layer. The substrate may likewise consist of silicon. Typically, the thickness of the insulating layer 2 is chosen between 0.5 and 1 μm, while the thickness of the silicon layer 3 may, for example, be between 5 and 20 μm. The crystal orientation and doping type of the substrate is arbitrary. The orientation and doping type of the silicon layer 3 corresponds to the basic technology used in the production of the sensor device and its semiconductor circuit arrangement.

In the illustrative embodiment according to FIG. 1 the side of the silicon layer 3 adjacent to the insulating layer 2 or to the lower boundary of the silicon layer is $n^+$-doped, while the surface region of the silicon layer remote from the insulating layer 2 is $n^-$-doped. The doping of the silicon layer 3 is not necessary for the actual sensor element but exclusively corresponds to the technology which is to be used for the integrated circuit arrangement.

The base body according to FIG. 1 may, for example, be a DWB wafer, DWB standing for Direct Wafer Bonding. Such wafers are formed by bonding together two semiconductor wafers and can be purchased on the market with high quality with the layer thicknesses and doping types shown in FIG. 1. A further possibility for the production of the base body shown in FIG. 1 is the use of the so-called SIMOX process (I. Ruge, H. Mader: Halbleiter-Technologie [semiconductor technology], Springer-Verlag, 3rd edition, 1991, page 237). In this case a silicon oxide insulating layer is formed by deep ion implantation of oxygen atoms into monocrystalline silicon. This is followed by an epitaxy step. A third possibility for the production of the base body according to FIG. 1 makes use of recrystallization, in which a silicon layer initially deposited in amorphous or polycrystalline form on a monocrystalline silicon layer and a silicon oxide layer arranged thereon is recrystallized by melting with a laser beam.

In a subsequent step, trenches are etched into the monocrystalline silicon layer 3, as far as the surface of the insulating layer 2, for example using an isotropic dry etching. The trenches are then filled with a doping insulant. In the illustrative embodiment according to FIG. 2, it is possible to use phosphorus glass (PSG) or boron-phosphorus glass (BPSG). The production of such glass layers is disclosed, for example, by D. Widmann, H. Mader, H. Friedrich: Technologie hochintegrierter Schaltungen [VLSI circuit technology], Springer-Verlag, 1988, pages 80 et seq. In a corresponding heat treatment, phosphorus and, optionally boron diffuse out of the phosphorus glass into the silicon of the trench walls of the silicon layer 3. This produces the structure shown in FIG. 2, in which the insulating layer 2 and the doping insulant layer 4 adjoin at the bottom of the previously etched trenches. The trench walls are doped according to the region of the silicon layer 3 adjoining the insulating layer 2, that is to say, in the illustrative embodiment, $n^+$-doped.

By the etching of trenches in the silicon layer and the doping of the trench walls, both the region SB, in which the actual sensor is provided, and the region TB, in which the electronic evaluation circuit, and at least one transistor arrangement for the processing of the sensor signal, is provided, are structured and isolated from each other. The region TB contains one or more insulated wells into which CMOS, bipolar or other components are incorporated, according to requirements. If the transistor arrangement to be produced in the region TB is, for example, a bipolar transistor, with the structure of the region TB shown in FIG. 2, a buried collector region and a low-impedance collector terminal in the form of the doped trench walls are already produced. In contrast to arrangements in the prior art, the production of the structure shown in FIG. 2 does not require separate masking and doping processes for the buried region, for a channel stopper and for a collector. An epitaxy process can likewise be omitted.

Figure 2:
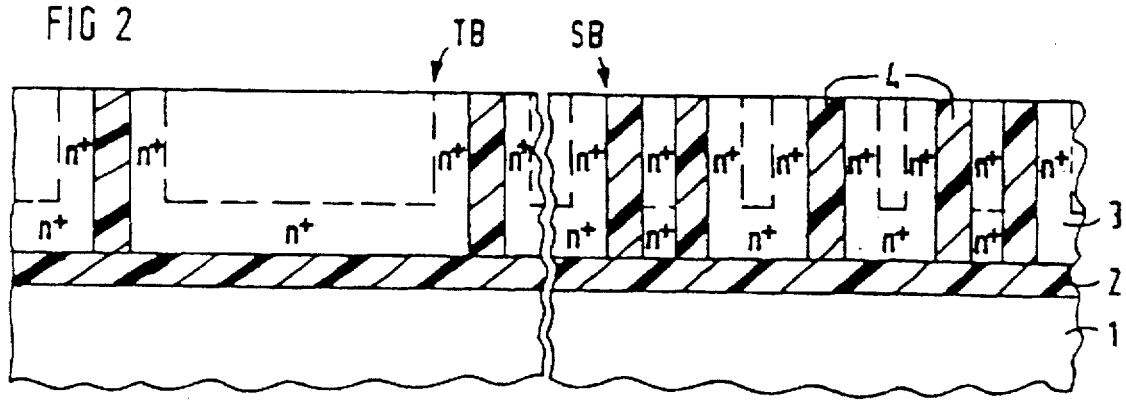

Starting from the structure in FIG. 2, a transistor arrangement is then produced in the region TB. This transistor arrangement can be produced using a standard bipolar or BICMOS process. Examples of such processes are, for example, disclosed by the abovementioned publication by Widmann/Mader/Friedrich: Technologie hochintegrierter Schaltungen. In the case of a bipolar transistor structure, starting from FIG. 2, the base region may, for example, be produced first, and in a BICMOS process, the p or n well may be produced first.

It is, of course, also possible, starting from the structure in FIG. 2, to produce a MOS transistor arrangement in the base body. In this case also, the standard process starts with the production of a p or n well in the region TB intended for the transistor structures.

Figure 3:
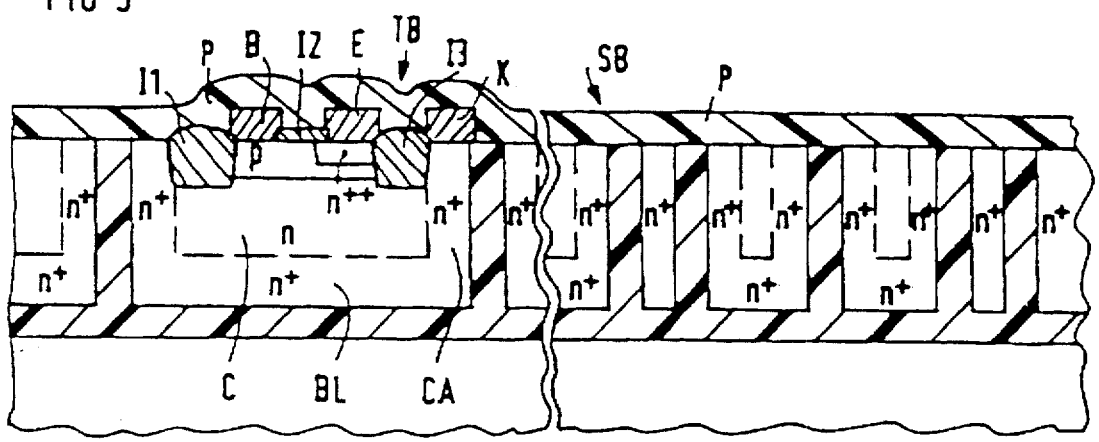

During the production of the transistor arrangement, the region SB, which is intended for the sensor element, is covered by a corresponding mask. According to FIG. 3, by way of example, a bipolar transistor is produced, the collector C of which is connected with low impedance via the buried region BL and the heavily doped low-impedance trench walls CA to the collector terminal K. A p-doped base is connected to the base terminal B. The emitter terminal E is accordingly arranged above the heavily doped $n^{++}$ region. The base, emitter and collection regions of the transistor are insulated on one another by insulation regions I1 to I3, preferably of silicon oxide $SiO_2$. A passivation layer P is then applied over the entire arrangement. By way of example, the passivation layer may consist of silicon nitride $Si_3N_4$.

Following the production of the transistor arrangement, the passivation layer P is removed over the sensor region SB with the aid of a resist mask FM, and then first the doping insulant 4 in the trenches of the sensor region, and subsequently the insulating layer 2, are removed at least in the partial regions of the sensor region SB. This can, for example, by a wet chemical or dry etching process. The insulating layer 2 is in this case removed completely under the mobile electrodes of the sensor element, and not completely under the nonmoving electrodes of the sensor element, so that the latter is still mechanically connected to the substrate 1.

Figure 4:
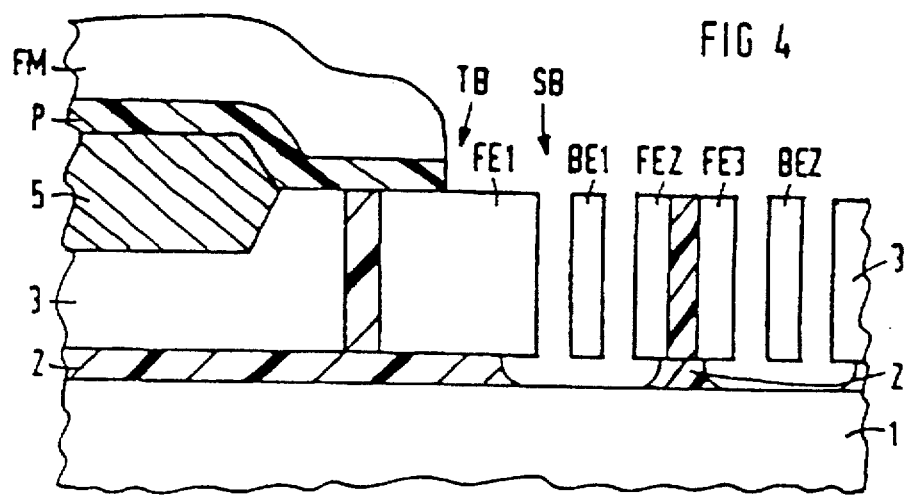

FIG. 4 shows an arrangement after the removal of the insulant 4 and of the insulating layer 2 near and under the moving electrodes BE1, BE2 of the sensor region SB, while the insulating layer 2 is still partially present under the fixed electrodes FE1, FE2 and FE3. In the arrangement according to FIG. 4, the transistor region TB is structured differently than in FIG. 3. While nothing has changed as regards the doping conditions of the silicon layer 3 in the arrangement in FIG. 4 compared to FIG. 2, an oxide layer 5 has been provided toward the edge of the sensor region in the transistor region of FIG. 4. The transistor region is covered by a passivation layer P and a resist mask FM lying above the latter.

Subliming chemicals, for example cyclohexane or dichlorobenzene, may be used in order to solve a sticking problem possibly occurring during the removal of the insulating layer 2 under the region of the mobile electrodes BEi.

The mask FM is removed following the described removal of the insulating layer.

Figure 5A:
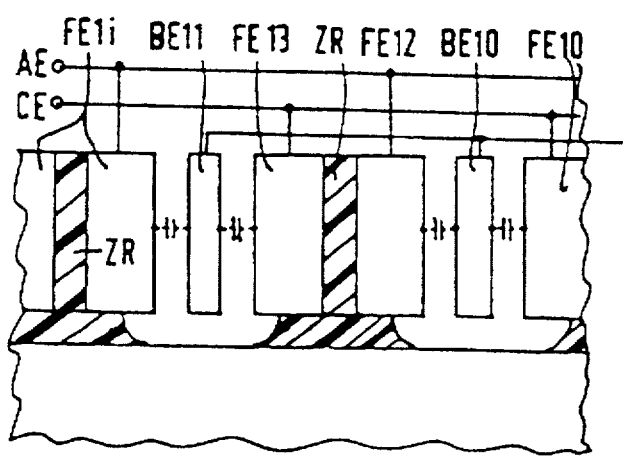
Figure 5B:
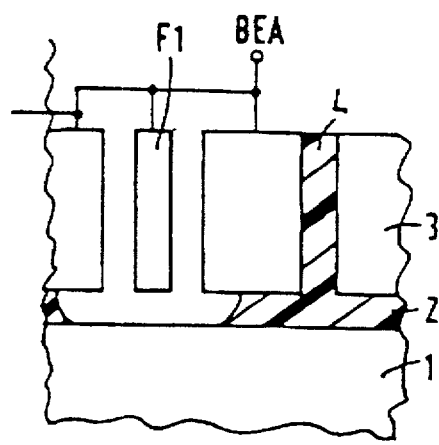

FIG. 5 shows cross-sections through a sensor structure which is represented in plan view in FIG. 6. It is an acceleration sensor which has a moving mass part M which is suspended by spring elements F1, F2 and other spring elements (not shown) from the silicon layer 3. The mass part M has finger-shaped moving electrodes BE10, BE11 and BE1i which project freely into regions between fixed electrodes FE10 to FE13 and FE1i. Capacitors, which are represented in FIG. 6 and in FIG. 5a purely schematically, are formed between the moving electrodes BEi and fixed electrodes FEi since the trench walls of the electrodes are heavily doped. FIG. 5a shows, for this case, a section along the line 5.1—5.1, and FIG. 5b shows a section along the line 5.2—5.2, these lines being indicated in FIG. 6. In order, during the production of the sensor part, to make it possible to reliably remove the insulating layer under the mass part, the mass part M contains holes L. In principle, however, the holes are not strictly necessary. The region of the special mask used for producing the sensor structures is sketched in FIG. 6. Within the region defined by the special mask SM, the doping insulant is completely removed from the trenches and the insulating layer near and below the moving electrodes, the mass part and the springs.

Figure 5C:
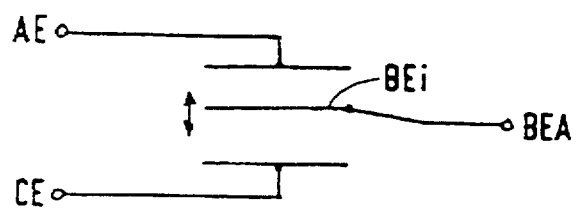

FIG. 5 shows the equivalent circuit diagram obtained with the sensor structure of FIGS. 5a and b, and FIG. 6. The moving electrodes BEi, that is to say BE10i to BE1i can be connected to a terminal BEA via the mass part M and the springs Fi. The fixed electrodes are connected in pairs to terminals AE and CE which correspond to the fixed plates of a capacitor. The moving electrodes form a moving capacitor plate, so that FIG. 5c represents a differential capacitor.

The doping insulant can be removed from the intermediate spaces ZR between two fixed electrodes, FIG. 5a. It is, however, possible for the intermediate spaces ZR of the fixed electrodes and the underlying insulating layer, which is adjacent to the respective fixed electrodes, to remain. This requires a different mask, with which the insulating layer and the doping insulant below and between the moving electrodes can be removed.

As an alternative to the structure in FIG. 5 and FIG. 6, the fixed electrodes can be mechanically connected to the substrate 1 or the insulating layer 2 in similar fashion to the abovementioned publication "Electronic Design". Fastening via a support results in self-supporting electrodes, which means that the fixed electrodes must have a flexural stiffness with regard to the acceleration forces which are exerted on them, which is sufficient to prevent additional measurement errors from having a negative effect on the measurement accuracy.

The sensor arrangement represented in FIG. 6 reacts sensitively to the movements of the mass part in the arrow direction indicated. The permissible deflection of the finger-shaped capacitive moving electrodes is less than the size of the gap separating it from a fixed electrode, that is to say less than approximately 1 μm. For this reason, the evaluation circuit of the sensor device is preferably configured as a control circuit, in such a way that a control voltage opposes a deflection of the mass part, in the sense that the partial capacitances formed by the differential capacitor are always equal. This method has the advantage that it is a centre-zero method and is therefore as a rule more accurate than an absolute method for determining the capacitance changes.

A two-dimensional acceleration measurement is possible if use is made of two sensor arrangements according to FIGS. 5 and 6 which are offset relative to each other by 90°. The oscillation directions of the respective mass parts are in this case two mutually orthogonal directions in the oscillation direction of the chip plane. The described technique can similarly be applied to the production of differential pressure sensors.

The invention has the following advantages:

The sensor mass part, the electrodes and the structural bars, that is to say the suspension springs of the sensor, consist of monosilicon, so that for the moving parts the flexural distortions and stresses known from polysilicon are avoided.

The mass part of the sensor and the spring constant of the flexural bar, as well as, in the case of a capacitive sensor, the sensor capacitance, can be set independently of one another so that sensor arrays can be produced with ease. The sensor arrangement makes it possible for the sensor to have a high packing density, since the electrodes extend perpendicularly to the chip surface, so that a large capacitive area can be achieved. The stiffness of the electrodes perpendicularly to the oscillation direction is very great, since the section modulus is proportional to the 3rd power of the electrode thickness. For this reason, where applicable, no sticking problem occurs, so that chemicals to counteract this problem are not required.

Since the moving parts of the sensor are located in the silicon or in the silicon layer, and not on the chip surface, the sensor is extraordinarily mechanically robust. By virtue of the arrangement of the electrodes and of the mass part in the chip plane, an overload cutout is also automatically provided in the chip plane.

When a bipolar or BICMOS standard process is used as the basic technology for the evaluation circuit of the intelligent sensor, the number of masks is not increased. This allows considerable cost savings and overall simplification of the production process.

In principle, the process and sensor device according to the invention can be combined with all known technologies. In particular, the sensor device is compatible with VLSI, so that structure dimensions of less than 1 μm can be achieved. The trench etching and filling processes, as well as the usual semiconductor processes, known from semiconductor technology can therefore be employed during production.

I claim:

1. An integrated micromechanical sensor device, comprising:

a sensor body formed of a substrate, a monocrystalline silicon layer disposed on said substrate, and an insulating layer disposed in a predetermined region between said substrate and said silicon layer;

said silicon layer having trenches with side walls formed therein from an upper surface thereof to a lower boundary surface, and said silicon layer having a first region above said insulating layer and a second region at which said insulating layer is at least partly missing;

said side walls of said trenches and a side of said silicon layer carrying the lower boundary surface having a first predetermined doping type, and said silicon layer having a second predetermined doping type at least in a partial region thereof;

a transistor configuration disposed in said first region of said silicon layer; and a sensor configuration disposed in said second region (SB) of said silicon layer.

2. The device according to claim 1, wherein said trenches formed in said first region are filled with an insulant.

3. The device according to claim 1, wherein said transistor congfiguration is one of a bipolar, MOS, and bipolar/MOS transistor configuration.

4. The device according to claim 1, including at least one spring, said sensor configuration being suspended from said at least one spring.

5. The device according to claim 1, wherein said sensor configuration is a capacitive sensor.

6. The device according to claim 1, wherein said sensor configuration is a piezoresistive sensor.

* * * * *